United States Patent [19]

Incremona

[11] 4,401,743
[45] Aug. 30, 1983

[54] AQUEOUS DEVELOPABLE PHOTOSENSITIVE COMPOSITION AND PRINTING PLATE

[75] Inventor: Joseph H. Incremona, Stillwater, Minn.

[73] Assignee: Minnesota Mining and Manufacturing Company, St. Paul, Minn.

[21] Appl. No.: 345,339

[22] Filed: Feb. 3, 1982

Related U.S. Application Data

[63] Continuation of Ser. No. 145,025, Apr. 30, 1980, abandoned.

[51] Int. Cl.³ .......................... G03C 1/54; G03C 1/60; G03C 1/71
[52] U.S. Cl. ..................................... 430/157; 430/158; 430/163; 430/176; 430/188; 430/302; 521/28; 525/389; 525/440; 525/442; 525/456; 204/159.19; 204/159.21; 260/141 F
[58] Field of Search ............... 430/175, 176, 163, 188, 430/302, 157, 158; 521/28; 525/389, 442, 456, 440; 204/159.19, 159.21; 260/141 F

[56] References Cited

U.S. PATENT DOCUMENTS

| | | | |
|---|---|---|---|
| 2,498,722 | 2/1950 | Straley | 260/141 F |
| 2,649,373 | 8/1953 | Neugebauer et al. | 430/175 |
| 3,199,891 | 8/1965 | Sus et al. | 430/157 |
| 3,219,447 | 11/1965 | Neugebauer et al. | 430/163 |
| 3,230,087 | 1/1966 | Sus et al. | 430/188 |
| 3,300,309 | 1/1967 | Chu | 430/175 |
| 3,677,979 | 7/1972 | Beaulien | 521/28 |
| 3,679,419 | 7/1972 | Gillich | 430/175 |
| 3,790,556 | 2/1974 | Doggett | 430/188 |
| 4,022,964 | 5/1977 | Lieser et al. | 521/28 |
| 4,052,368 | 10/1977 | Larson . | |
| 4,307,219 | 12/1981 | Larson | 525/440 |

OTHER PUBLICATIONS

Rauner, F., et al., Abstract of Ser. No. 8,061, filed 2/1970, Publ. in 876OG816, on 7/28/1970, 430–176.
Chemical Abstracts, vol. 85, #54617e, 1976.

Primary Examiner—Charles L. Bowers, Jr.
Attorney, Agent, or Firm—Cruzan Alexander; Donald M. Sell; Gerald F. Chernivec

[57] ABSTRACT

A light-sensitive adduct comprising the combination of a diazo resin having a plurality of pendant diazonium groups and a sulfonated polymer having a plurality of sulfonate groups and a presensitized light-sensitive article comprising a substrate having a light-sensitive coating which is comprised of the light-sensitive adduct on a surface thereof. After imagewise exposure, unexposed portions of the coating are removable by water or aqueous developers.

12 Claims, No Drawings

AQUEOUS DEVELOPABLE PHOTOSENSITIVE COMPOSITION AND PRINTING PLATE

This is a continuation, of application Ser. No. 145,025 filed Apr. 30, 1980, now abandoned.

TECHNICAL FIELD

This invention relates to a light-sensitive composition which is water or aqueous solvent developable. More specifically, the invention relates to a light-sensitive adduct which is derived from combining a resin having a plurality of pendant diazonium sites, i.e., a diazo resin, with a polymer having a plurality of sulfonated groups.

BACKGROUND ART

Diazonium compounds are well known and widely used in the preparation of negative-acting lithographic printing plates to impart light sensitivity thereto. Upon exposure, the photochemical decomposition of the diazonium salt produces physical and chemical changes, such as crosslinking, insolubility, increased adhesion, etc. Most commonly utilized diazonium compounds are the diazo resins, such as those described in U.S. Pat. No. 2,714,066, which are synthesized by the condensation reaction of an active carbonyl compound with a diazo compound.

These diazonium resins are disclosed in many patents and have been coated either alone, such as in U.S. Pat. No. 2,714,066; overcoated with a resinous layer, such as is disclosed in U.S. Pat. No. 3,136,637; overcoated with a photopolymer, such as is disclosed in U.S. Pat. No. 3,905,815; or included in conjunction with other resinous materials such as is disclosed in U.S. Pat. No. 3,660,097.

Variations in the properties of diazo resins have been achieved by employing different anions therewith, e.g., as is disclosed in U.S. Pat. No. 3,790,556, wherein the solubility properties thereof are changed as well as humidity resistance, i.e., storage life. Furthermore, simple monomolecular diazonium salts have been reacted with high molecular weight sulfonated phenol-formaldehyde resins, as disclosed in U.S. Pat. No. 3,199,981, to prepare, in association with other resins, positive printing plates from positive originals.

One common characteristic of light-sensitive lithographic plates utilizing diazo resins is that the resin has a tendency to remain or adhere in the non-image areas after chemical development or processing. This small amount of unrecovered resin results in an ink toning and scumming condition in the background of the plate during the subsequent printing process. The reasons for the unremoved diazo resin in the non-image areas are believed to be due to physical attachment thereof to the substrate, insoluble fractions, minor decomposition products, or perhaps for a combination of these reasons. This specific problem is typically solved by utilizing special chemicals in the developer, typically called desensitizing agents, which aid in the removal of this unexposed diazo resin material. For example, U.S. Pat. Nos. 3,905,815; 3,891,438; 3,891,439; and 3,669,660 disclose solutions to the foregoing problem.

Surprisingly, I have now found a light-sensitive adduct derived from a combination of a diazo resin having a plurality of pendant diazonium sites with a polymer having a plurality of sulfonated groups, the adduct being capable of eliminating the problem discussed above. While it might be anticipated that such a combination of polyionic species would result in a completely insoluble ionically crosslinked mass, not suitable for printing plate utility, such has not been the case. A soluble and highly useful material for presensitized printing plates has resulted from the combination. In fact, the use of this adduct in a presensitized printing plate construction allows for the substantial elimination of the necessity for desensitizing salts in a developer solution.

A wide variety of simple developers and techniques can be utilized to prepare a printing plate made with the adduct, such as water or water/alcohol, simple machine processors, and, in some instances, on-press processing. Obviously, the simplicity of the developer used in providing the printing plate is environmentally desirable because of the reduced necessity for desensitizing agents and conventional harsh or polluting developers.

DISCLOSURE OF INVENTION

In accordance with the invention, there is provided a light-sensitive adduct comprising the combination of a diazo resin having a plurality of pendant diazonium groups with a sulfonated polymer having a plurality of sulfonate groups, and a presensitized light-sensitive article capable of providing a lithographic printing plate.

The use of the adduct in a coating composition to provide a presensitized lithographic plate affords the ability to develop and desensitize an exposed plate with water or simple aqueous developers.

DETAILED DESCRIPTION

As used herein, the term "adduct" is defined as the product derived from the addition of a diazo resin having a plurality of pendant diazonium groups with a sulfonated polymer having a plurality of sulfonate groups.

Exemplary diazo resins suitable for use in my invention are described in U.S. Pat. No. 2,714,066, with the preferred resins being the salts of the condensation product of paraformaldehyde and p-diazodiphenylamine. The anion associated with the diazo resin is not of particular importance with the exception of solubility characteristics relative to the reaction and coating solvent used.

Exemplary sulfonated polymers having utility herein include the alkali metal salt polyesters described in U.S. Pat. No. 4,052,368. These materials are particularly useful due to the wide variety and concentrations of diols, sulfomonomer and carboxylic acids that may be selected. Other sulfonated polyesters having utility herein include those disclosed in U.S. Pat. Nos. 3,779,993; 3,639,352; and 3,853,820.

These sulfonated polyesters are prepared by conventional techniques, typically involving the reaction of dicarboxylic acids (or diesters, anhydrides, etc. thereof) with monoalkylene glycols and/or polycaprolactone diols in the presence of acid catalysts, such as antimony trioxide, utilizing heat and pressure as desired. Normally, an excess of the glycol is supplied and subsequently removed by conventional techniques during the later stages of polymerization. When desirable, a hindered phenol antioxidant may be added to the reaction mixture to protect the polyester from oxidation.

Another class of useful sulfonated polymers includes the sulfonated polyurethanes having hydrophilic and hydrophobic segments as described in U.S. Pat. No. 4,307,219. These materials are derived from low molecular weight sulfonated polyester prepolymers, diisocyanates, and, optionally, various chain extenders. These polymers also provide a reactive sulfonate moiety which combines readily with a diazo group, and exhibit good physical properties such as flexibility, non-tackiness, abrasion resistance and water or water/alcohol dispersability.

Hydrophilic diols useful in the preparation of these polyurethanes are the bis($\omega$-hydroxyaliphatic) esters of sulfosubstituted aromatic dicarboxylic acids.

Examples of diols used for the hydrophobic segment of the sulfonated polyurethane polymers are aliphatic and cycloaliphatic diols, optionally containing aromatic groups and low molecular weight polyoxyalkylene diols. Exemplary compounds include butane diol, neopentyl glycol, polycaprolactone diol, and bis-(hydroxyethyl)terephthalate. Other examples include the well-known polyester diols generally prepared by the condensation of one or more diols with one or more dicarboxylic acids, such as succinic acid, adipic acid, and maleic acid.

Diisocyanates useful in preparing these polyurethanes include tolylene-2,4-diisocyanate and diphenylmethane-4,4-diisocyanate, among others.

These sulfonated polyurethanes are prepared in solution under anhydrous conditions using conventional polyurethane preparation methods.

These linear polyurethanes provide a reactive sulfonate moiety which can combine with the diazo resin moiety as well as provide physical properties desirable for lithographic plates, such as flexibility, abrasion resistance, water or alcohol/water solubility/dispersibility, hydrophobicity, etc.

Since diazo resins are cationically charged and sulfonated polymers anionically charged, the reaction between the two is believed to be of an ion exchange type, and in some instances the light-sensitive adduct formed can be precipitated and isolated as a powder or as a somewhat gummy material.

Separate solutions of the sulfonated polymer and diazo resin can be prepared such that the ratio of diazonium ions to sulfonate ions is 1:1. The solutions can then be combined and the resulting precipitate washed with water and dried. The yield is virtually quantitative when the stoichiometry is 1:1. For other ratios, the product may not precipitate in a filterable state and remain suspended. When the adduct is derived from a sulfonated polyester with a diazo, the salt precipitates as a gummy material, whereas the sulfonated polyurethane/diazo reaction product is generally a fine, easily filterable, amorphous solid.

Solvent systems are chosen such that the sulfonated polymer and diazo resin are both soluble therein, while the adduct is not. Aqueous alcohol solutions are most advantageous for use in the preparation of the adduct if isolation thereof is desired.

The diazo/sulfonated polymer adduct can be redissolved in polar solvents such as dimethylformamide, $\gamma$-butyrolactone, and N-methylpyrrolidinone. Once dissolved, it has been found that a solution can be further diluted with other solvents as 2-methoxyethanol, methyl ethyl ketone, 1-propanol, ethylene dichloride, etc. The adducts are also soluble in non-solvents, such as 2-methoxyethanol, which contain some of the sulfonated resin dissolved therein.

To prepare a coating solution for preparation of a printing plate, an adduct can be prepared as above and simply dissolved in a suitable solvent. Alternatively, solutions of the sulfonated polymer and diazo resin can be prepared using a solvent system in which the resulting adduct is also soluble. In this manner, a coating solution can be directly prepared. Suitable solvents are essentially the same as noted above and include 2-methoxyethanol, dimethylformamide, $\gamma$-butyrolactone, N-methyl pyrrolidinone, and combinations thereof.

Coating solution concentration can typically range from about 1 to about 20 percent by weight, depending on the coating method chosen, solution viscosity, the desired dry coating weight, and the avoidance of precipitation.

For the preparation of a light sensitive printing plate, it has been found that the ratio of diazo to sulfonate equivalents should be less than about 1.5 to 1, with from 0.1 to about 0.6 to 1 being preferred. As increasing equivalents of diazo are used, the ability of the resultant plate to be desensitized is reduced, because less diazo is tied to the sulfonate groups, and additional agents become necessary in the developer.

The sulfonated polymer should contain one sulfonate group per about 500 to about 8,000 molecular weight of polymer, with the preferred range being from about 1500 to about 3,000 molecular weight. As the sulfonate equivalent weight increases, the diazo can become diluted in the sulfonate polymer, thereby reducing light sensitivity. Therefore, the ratio of diazo equivalents should be correspondingly increased to impart increased light sensitivity and physical characteristics.

For presensitized printing plate formulations, polymeric thermoplastic resins may be used as additives, in conjunction with the compositions of my invention to modify or improve the physical properties of the coating. For example, properties such as developer solubility, abrasion resistance, ink receptivity, press life, etc. can be influenced by the addition thereof in amounts from about 20 to about 60 percent by weight. Suitable resins include the sulfonated polymers themselves, polyesters, polyurethanes, nylons, vinylidene chloride copolymers, polyvinyl esters, polyacrylates, and alpha-alkyl polyacrylates, polyvinyl chloride, polyvinyl acetals, and polyvinyl alcohols, among others. The amount and type of resin added to improve the plate formulation depends upon the specific property being altered and is arrived at (by trial and error) empirically.

Substractive presensitized plates are also typically formulated with pigments or dyes to facilitate manufacturing control and visual appearance of the product, as well as to aid in using the plate relative to positioning, developing, etc. Pre-dispersed pigments such as Microlith Blue (tradename for phthallocyanine pigment pre-dispersed in a vinyl resin, available from Ciba Geigy) are useful at from about 5 to about 20 weight percent of the coating. Pigments such as Monastral Blue can also be used in the same general concentration range using standard milling dispersion techniques. Dyes such as triphenyl methane dyes, e.g., Victoria Blue BO, commercially available from duPont, are also useful as coloring agents, preferably at from about 2 to about 5 percent by weight of the coating.

Dyes which provide a visible image upon exposure to actinic radiation may also be incorporated in the formulation to aid a user in visualizing the exposed plate prior to development. Conventional well-known leuco dye and acid-base dye printout systems can be utilized. An exemplary material is 4-(phenylazo)-diphenylamine, which can be used at from about 1 to 2 percent by weight of the coating.

In addition, photopolymerizable components may be incorporated into the formulation to enhance the solubility differential between image and non-image areas. Unsaturated polyfunctional monomeric or oligomeric compounds, which can be polymerized under the influence of light, include acrylic esters, acrylamides, etc. Preferably, a photoinitiator would also be included in the photopolymer formulation at from about 1 to about 5 percent by weight of the coating. Preferred photoinitiators include the chromophore-substituted vinyl-halomethyl-s-triazines disclosed in U.S. Pat. No. 3,987,037.

The photosensitive solutions can be coated on sheet materials such as paper, plastic, or metal and preferably on those that are permanently hydrophilic and conventionally used in the preparation of lithographic plates. Aluminum, which has first been cleaned and treated to render same permanently hydrophilic is the preferred substrate. Well-known methods of treatment include silicating, electrolytic anodizing, mechanical graining, or combinations thereof. In addition to providing a durable hydrophilic background, the type of treatment can also influence coating performance characteristics, such as exposure time, ease of development, image adhesion, press life, etc. The versatility and wide variety of light sensitive coating compositions made possible by my invention allows one to select or arrive at preferred combinations of base and coating to achieve optimum performance.

Coating weights in the range of from about 5 to about 150 milligrams per square foot may be used, with from about 20 to about 80 milligrams per square foot being preferred.

If desired, the coating solution can be overcoated onto a diazo presensitized base such as described in U.S. Pat. No. 2,714,066. In this case, excess sulfonated polymer is used, wherein the sulfonated polymer combines with the diazo layer which affords desensitization of the background without necessity of added desensitizing salts in the developer. Improved humidity resistance has also been noticed.

Developers useful for developing the imaged composition include aqueous solutions with or without the inclusion of organic solvents, buffers, desensitizers, surfactants, stabilizers and gums. In general, the adducts of sulfonated polyesters can be developed with water or in fact press-developed, whereas many of the adducts of polyurethanes, while they can be developed with water alone, are more easily developed with dilute alcohol-water solutions. Exemplary alcohols include ethanol, 1-propanol, 2-propanol, benzyl alcohol and 2-methoxyethanol, and can be used at a concentration of from about 5 to about 37 percent by weight, depending on the alcohol selected and its solvent power. For example, the concentration of 1-propanol or 2-propanol at 20 to 37 percent by weight is preferred, whereas that preferred for 2-methoxyethanol and benzyl alcohol is from about 5 to about 10 percent by weight. Other water-miscible solvents which can be used include ethylene glycol diacetate and γ-butyrolactone.

The addition of anionic surfactants or desensitizing salts to an alcohol/water solution results in a developer which dissolves the coating in the non-image areas of the plate, rather than merely facilitating the physical scrubbing off of the coating. This provides the easiest development and is required for simple dip-tank mechanical plate processors.

Exemplary anionic surfactants include arylsulfonates such as sodium dodecylbenzenesulfonate and dimethyl-5-sodiumsulfoisophthalate, sulfate salts of aliphatic alcohols such as sodium lauryl sulfate, and sodium dialkyl sulfosuccinates such as dioctyl sodium sulfosuccinate.

Exemplary desensitizing salts include ammonium sulfite, sodium sulfite, etc. The surfactants or desensitizing salt can be used in a concentration of from about 0.5 to 10 percent by weight, and preferably from about 0.5 to 2.0 percent by weight of the developer solution.

The invention will now be more specifically described by use of the following non-limiting examples, wherein all parts are by weight unless otherwise specified.

EXAMPLE 1

Preparation of a Sulfonated Polyester

A 1,000 ml three-necked, round-bottomed flask equipped with a sealed stirrer, thermometer, and condenser was charged with 7.4 grams (25 mole percent) of dimethyl-5-sodium sulfoisophthalate, 145.6 grams (75 mole percent) of dimethyl terephthalate, 26.5 grams (50 mole percent) of polycaprolactone diol (PCP-0200, commercially available from Union Carbide), 62 grams (100 mole percent) of ethylene glycol, 0.06 grams of zinc acetate and 1.5 grams of sodium acetate. The flask and contents were flushed with nitrogen to remove air and thereafter during the esterification an inert atmosphere was maintained by passing a slow flow of nitrogen through the apparatus.

The reaction mixture was stirred and heated between 180° C. and 200° C. for 97 minutes, or until the pot temperature rose to 200° C., indicating that most of the methanol from the transesterification reaction had been removed. Over a 30 minute period, the temperature was raised to 225°–235° and maintained while pressure was slowly reduced to 0.18–0.25 Torr over a period of 25 minutes and excess ethylene glycol was removed. The system was then brought to atmospheric pressure with nitrogen and the hot polymer drained into a polytetrafluoroethylene-coated pan, yielding a water soluble resin. The sulfonate equivalent weight of the resin was calculated to be 1800. Other sulfonated polyesters prepared by this method which are examples of polymers useful in the invention are listed in Table I.

TABLE I

| Ex. | Mole Percent DMSSIP (1) | Mole Percent DMT (2) | Mole Percent Other | Mole Percent PCP (3) | Mole Percent EG (4) | Mole Percent Other | Sulfonate Equivalent Weight |
|---|---|---|---|---|---|---|---|
| 2 | 10 | 90 | | 15 | 85 | | 2726 |
| 3 | 15 | 85 | | 50 | 50 | | 2942 |
| 4 | 25 | 75 | | 25 | 75 | | 1339 |
| 5 | 25 | 75 | | 95 | 5 | | 2649 |
| 6 | 15 | 65 | 20 Sebacic Acid | | 100 | | 1431 |
| 7 | 25 | 75 | | 100 | | | 2743 |
| 8 | 25 | 75 | | 70 | | 30 | 2181 |

TABLE I-continued

| Ex. | Mole Percent DMSSIP (1) | Mole Percent DMT (2) | Mole Percent Other | Mole Percent PCP (3) | Mole Percent EG (4) | Mole Percent Other | Sulfonate Equivalent Weight |
|-----|---|---|---|---|---|---|---|
|     |   |   |   |   |   | (hexane diol) |   |

(1) DMSSIP = Dimethyl-5-sodium sulfoisophthalate
(2) DMT = Dimethyl terephthalate
(3) PCP = Polycaprolactone diol
(4) EG = Ethylene glycol

EXAMPE 9

Preparation of a Sulfonated Prepolymer

A 1,000 ml three-necked, round-bottomed flask equipped with a sealed stirrer, nitrogen purge and a condenser set for distillation was charged with 88.9 grams (0.30 moles) dimethyl-5-sodiumsulfoisophthalate, 318 grams (0.60 moles) of PCP-0200 (tradename for a polycaprolactone diol, molecular weight 530, available from Union Carbide), 0.04 gram of tetraisopropyl titanate and 0.8 gram of triethylamine. The flask and contents were flushed with nitrogen to remove air and thereafter during the transesterification an inert atmosphere was maintained by passing a slow flow of nitrogen through the apparatus.

The reaction mixture was heated in a 230° C. Woods metal bath for 1.5 hours or until the distillation of methanol ceased. The pressure was slowly reduced to 20 Torr and that pressure was maintained for 15 minutes. The system was then brought to atmospheric pressure with nitrogen and the hot prepolymer drained into glass jars and sealed. The hydroxyl equivalent weight was determined by the phenyl isocyanate titration method using diglyme as the solvent. The hydroxyl equivalent weight of this example was 1,000 and can range from 750 to 1500.

EXAMPLE 10

Preparation of a Sulfonated Polyurethane Resin

In a 1,000 ml three-necked, round-bottomed flask equipped with a stainless steel stirrer, inert gas inlet and a reflux condenser, were charged 200 grams (0.10 moles) of the sulfonated prepolymer from Example 9. The prepolymer was dissolved in 200 grams of dry methyl isobutyl ketone with stirring at 100° C. The solution was cooled to 60° C. and 87.0 grams (0.50 moles) of tolylene-2,4-diisocyanate was charged in one portion. The reaction mixture was stirred at 80° C. for 30 minutes, after which 85.2 grams (0.2 moles) of diol (2:1 cyclohexane dimethanol:maleic anhydride condensation product) were charged.

The reaction was stirred for an additional 30 minutes at 80° C., after which 12.4 grams (0.20 moles) of ethylene glycol was charged. The reaction temperature was raised to 115° C. and stirring was continued for 2 to 3 hours (or until the high viscosity of the reaction prevents stirring). The reaction was quenched by the slow addition of 300 grams of 2-methoxyethanol, and the finished polymer was stored in solution. The sulfonate equivalent weight of the polymer was 2,485.

Examples of other polyurethane compositions are illustrated in Table II.

TABLE II

| Example | Sulfonated Prepolymer | Molecular Weight | TDI (1) | MDI (2) | PCP-0200 (3) | BHET (4) | Unsat'd Diol (5) | EG (6) | Butane Diol | Pentane Diol | Hexane Diol | Sulfonate Equivalent Weight |
|---|---|---|---|---|---|---|---|---|---|---|---|---|
| 11 | 1 | 1950 |   | 2 |   | 1 |   |   |   |   |   | 1791 |
| 12 | 1 | 1950 |   | 2 |   |   |   |   |   |   | 1 | 1701 |
| 13 | 1 | 1950 |   | 2 | 1 |   |   |   |   |   |   | 1974 |
| 14 | 1 | 1700 |   | 3 | 2 |   |   |   |   |   |   | 2668 |
| 15 | 1 | 1700 |   | 4 | 3 |   |   |   |   |   |   | 3260 |
| 16 | 1 | 1700 | 3 |   |   |   | 2 |   |   |   |   | 2334 |
| 17 | 1 | 1700 | 5 |   |   |   | 2 | 2 |   |   |   | 2695 |
| 18 | 1 | 2190 |   | 5 | 2 |   |   |   | 2 |   |   | 2761 |
| 19 | 1 | 2190 |   | 7 | 2 |   |   |   | 4 |   |   | 3162 |
| 20 | 1 | 2190 |   | 7 | 2 |   |   |   |   |   | 4 | 3195 |
| 21 | 1 | 2190 |   | 3.5 | 0.5 |   |   |   |   |   | 2 | 2087 |
| 22 | 1 | 2190 |   | 5 |   |   | 2 | 2 |   |   |   | 2605 |
| 23 | 1 | 2190 | 2 |   |   |   | 1 |   |   |   |   | 1748 |
| 24 | 1 | 2190 |   | 3.5 | 2 |   | .5 |   |   |   |   | 2452 |

(1) Tolylene-2,4-diisocyanate
(2) Methylenebis(4-phenyl isocyanate)
(3) Polycaprolactone diol, 530 MW (Niax Polyol, Union Carbide)
(4) Bis(hydroxyethyl) terephthalate
(5) 2:1 condensation product cyclohexanedimethanolmaleic anhydride (426 MW)
(6) Ethylene glycol

EXAMPLE 25

Preparation of a Polyester-Diazo Adduct

A photosensitive polymeric diazonium-sulfonated polyester adduct was prepared as follows:

Three grams of the sulfonated polyester of Example 3 was calculated to contain 1.0 milliequivalent of sulfonate ion. This was dissolved with stirring in 15 percent 1-propanol/water at 5 percent solids to furnish a clear solution. This solution was further diluted to 1 percent solids and cooled to 10° C. To this chilled solution were added dropwise with stirring 32 ml of a 1 percent solution (1.0 milliequivalent) of the zinc chloride double salt of the formaldehyde condensation product of p-diazodiphenylamine. At the end point a cheesy solid agglomerated which was filtered and washed with cold water. The solid could be dried in vacuo, if desired, or immediately dissolved and coated.

Adducts of the other polyesters listed in Table I can be prepared in a similar manner.

EXAMPLE 26

Preparation of a Polyurethane-Diazo Adduct

Twenty-seven grams of the sulfonated polyurethane of Example 17 was dissolved in 270 ml of 20 percent 1-propanol/water. The resulting clear solution was calculated to contain 1.0 milliequivalent of sulfonate ion. This solution was cooled to 10° C. and added over 15 minutes to a cold, stirred solution of 3.12 grams (1.0 milliequivalent) of the zinc chloride double salt of the formaldehyde condensation product of p-diazodiphenylamine. At the end point a fine granular precipitate formed which was filtered, washed with water and dried in vacuo. If allowed to dry in air, the product darkens noticeably.

Adducts of the other polyurethanes listed in Table II can be prepared in a similar manner.

EXAMPLE 27

A coating solution was prepared by mixing the following ingredients:

|  | Parts by Weight |
|---|---|
| Sulfonated polyester of Example 5 | 1.00 |
| Diazo sensitizer* | .05 |
| Victoria Blue Dye (duPont) | .02 |
| 2-Methoxyethanol | 19.0 |

*triisopropylnaphthalene sulfonate salt of the formaldehyde condensation product of 4-diazodiphenylamine whereby the ratio of diazo to sulfonate equivalents was 0.24 to 1.

The solution was coated onto a silicated aluminum foil paper laminate at 30 milligrams per square foot dry coating weight and dried. The plate was exposed imagewise and mounted on an AM 1250 printing press. By dropping the dampening rollers for 10 revolutions, followed by 10 revolutions with the ink rollers, the fifth copy printed had a dense image area and a clean, scum-free background. Alternatively, the plates could be developed with tap water. The plate rolled up clean even after oven storage at 140° F. for 3 days.

The preferred sulfonated polymers for this plate are the sulfonated polyesters, and in particular those which contain from 70 to 100 mole percent polycaprolactone diol and 25 mole percent sodium sulfoisophthalate (Examples 5, 7 and 8).

EXAMPLE 28

The diazo polyester adduct of Example 25 can be dissolved in a solution of additional polyester and coated on silicated aluminum to prepare a water-developable short run plate. A coating solution was prepared and coated as in Example 27 containing:

|  | Parts by Weight |
|---|---|
| Sulfonated polyester of Example 3 | .50 |
| Diazo-polyester adduct of Example 25 | .50 |
| Victoria Blue Dye (duPont) | .02 |
| 2-Methoxyethanol | 19.0 | resulting in a ratio of diazo to sulfonate equivalents of 0.48 to 1.

The solution was coated onto silicated smooth aluminum at 30 milligrams per square foot dry coating weight and dried in a stream of warm air. After exposing imagewise to actinic radiation, the plate was developed with tap water and gentle scrubbing, furnishing a plate with a clean background (totally desensitized) and an oleophilic image area. The plate was still easily water developed after three days at 140° F. storage. Water developable plates can also be prepared using the solution method of Example 27, rather than by separate preparation of the diazo adduct.

Several of the sulfonated polyurethanes are also suited for water-only developable plate coatings using the methods in Examples 27 and 28 including Examples 11–15, 21, 23, and 24.

EXAMPLE 29

Sulfonated polyurethanes can be combined with sulfonated prepolymers to enhance water developability. A coating solution was prepared by mixing the following ingredients until homogeneous:

|  | Parts by Weight |
|---|---|
| Sulfonated polyurethane of Example 17 | .90 |
| Diazo sensitizer* (added as 10% solution in dimethyl formamide) | .05 |
| Sulfonated polyester prepolymer of Example 9 | .10 |
| Microlith Blue 4G-T pigment (added as 18% solution in methyl ethyl ketone) | .14 |
| 4-Phenylazodiphenylamine | .02 |
| 2-Methoxyethanol | 19.0 |

*$BF_4$ salt of the formaldehyde condensation product of 4-diazodiphenylamine resulting in a ratio of diazo to sulfonate equivalents of 0.41 to 1.

The solution was coated on smooth silicated aluminum to a dry coating weight of 50 milligrams per square foot, dried in a stream of warm air and exposed imagewise to actinic radiation. The plate was easily developed with tap water and gentle scrubbing. Other polyurethanes which can be utilized include Examples 16 and 21.

EXAMPLE 30

Another method to prepare water developable printing plates with the polyurethanes of Examples 17, 18, and 22 is to use a diazo salt other than a tetrafluoroborate salt.

A coating composition was prepared by milling the following imgredients until homogeneous:

|  | Parts by Weight |
|---|---|
| Sulfonated polyurethane of Example 17 | 1.00 |
| Diazo sensitizer** | .10 |
| Monastral Blue G pigment (duPont) | .10 |
| 4-Phenylazodiphenylamine | .02 |
| 2-Methoxyethanol | 10.0 |

**2-hydroxy-4-ethoxybenzophenone-5-sulfonate salt of the formaldehyde condensation product of 4-diazo diphenylamine resulting in a ratio of diazo to sulfonate equivalents of 0.52 to 1.

The solution was coated as in Example 30. The plate thus prepared was developed and desensitized using tap water and gentle scrubbing.

For coating compositions containing sulfonated polymers with lesser amounts of sulfonate and/or polycaprolactone than used for Examples 27-29, the ease of water development decreases. Aqueous solutions containing small amounts of organic solvents are, however, useful as developers for these compositions. Alcohols such as ethanol, 1-propanol and benzyl alcohol; ether-alcohols such as 2-methoxyethanol; ketones such as acetone, methyl ethyl ketone and cyclohexanone and esters such as ethyl acetate may be used at from 1 to 40 percent by weight in water to develop and desensitize plates. The optimum solvent concentration is best determined empirically for a given plate construction to achieve the optimum solubility differential between image and background. The polyesters of Examples 2 and 4 and the polyurethanes of Examples 16-20 are representative of sulfonated polymers which, when coated with diazo, are water developable with some difficulty, but are easily developed with these developers.

EXAMPLE 31

A coating solution was prepared by mixing the following ingredients:

|  | Parts by Weight |
|---|---|
| Sulfonated polyurethane of Example 17 | .90 |
| Diazo sensitizer (BF$_4$ salt as in Example 29) | .05 |
| Monastral Blue G pigment (duPont) | .10 |
| 4-(Phenylazo) diphenylamine | .02 |
| 2-Methoxyethanol | 19.0 | resulting in a ratio of diazo to sulfonate equvalents of 0.51 to 1.

The solution was milled to suspend the pigment and then coated as before to a dry coating weight of 50 milligrams per square foot. The plate was easily developed and desensitized with hot water (120° to 130° F.), but not with water at room temperature. The plate can be easily developed with 20 percent by weight 1-propanol/water at normal temperatures (55° to 90° F.).

EXAMPLE 32

The addition of photopolymerizable components (e.g., polyfunctional acrylate ester monomers) to the sulfonated polymer/diazo coatings generally results in increased solvent resistance after exposure. On grained surfaces the monomeric components also improve the developability of the coatings.

A coating composition was prepared by milling the following ingredients until homogeneous:

|  | Parts by Weight |
|---|---|
| Sulfonated polyurethane of Example 20 | .70 |
| Diazo sensitizer (BF$_4$ salt as in Example 29) | .05 |
| Monastral Blue G pigment (duPont) | .10 |
| Triacrylate of tris-hydroxyethyl isocyanurate (Sartomer resin SR-368) | .30 |
| 2-(p-methoxystyryl)-4,6-bis-(trichloromethyl)-s-triazine | .03 |
| 2-(p-dimethylaminostyryl)quinoline | .02 |
| 2-Methoxyethanol | 19.0 | resulting in a ratio of diazo to sulfonate equivalents of 0.77 to 1.

The mixture was coated on smooth silicated aluminum as before and developed with an aqueous developer of the type described in Example 31.

EXAMPLE 33

Under certain circumstances it is desirable to improve the ease of development to the point where the developer actually dissolves the plate coating in the non-image areas. This allows rapid development of a plate without any scrubbing action and also makes possible the use of simple automatic plate processors. The use of certain developers with the coatings of this invention eliminates the need for complicated plate processors which may require pumps, filters, heaters and elaborate scrubbing mechanisms.

A coating composition was prepared by milling together the following ingredients until homogeneous:

|  | Parts by Weight |
|---|---|
| Sulfonated polyurethane of Example 17 | .43 |
| Diazo-polyurethane adduct of Example 27 | .45 |
| Monastral Blue G pigment (duPont) | .087 |
| 4-Phenylazodiphenylamine | .01 |
| Polyacrylic acid (Acrysol A-3, Rohm & Haas) | .025 |
| 2-Methoxyethanol | 19.0 | resulting in a ratio of diazo to sulfonate equivalents of 0.49 to 1.

The solution was coated as before on smooth, silicated aluminum, dried and imaged. Samples were developed with the solutions listed in Table III.

TABLE III

| DEVELOPER COMPOSITIONS Parts by Weight | | | | |
|---|---|---|---|---|
| Example No.: | 34 | 35 | 36 | 37 |
| water | 59.75 | 73 | 94 | 93 |
| 1-propanol | 37.0 | 25 | | |
| benzyl alcohol | | | 5 | 3 |
| ethylene glycol diacetate | | | | 3 |
| trisodium EDTA | 0.25 | | | |
| monoammonium phosphate | 1.5 | | | |
| ammonium sulfite | 1.5 | | | |
| sodium dodecylbenzene-sulfonate | | | 1 | 1 |
| dimethyl sodium-5-sulfoisophthalate | | 2.0 | | |

All of the above developers dissolved the plate coating in the non-image areas when the plate was soaked in a static bath for 10 to 20 seconds. This allows the use of simple processors if desired. Alternatively, a developing pad may be used, in which case development is virtually instantaneous. In addition, these developers may be used with the plates described in Examples 30-33.

EXAMPLE 38

The polyurethane-diazo adduct can also be coated alone on silicated aluminum to produce a printing plate. A mixture of the following components was prepared by milling the following ingredients until homogeneous:

|  | Parts by Weight |
|---|---|
| Polyurethane-diazo adduct of Example 26 | 1.00 |
| Monastral Blue G pigment | .10 |
| 4-Phenylazodiphenylamine | .02 |
| Dimethyl formamide | 19.0 |

The mixture was coated on smooth silicated aluminum to a dry coating weight of 50 milligrams per square foot and imaged in the conventional manner. The plate could be developed using any of the developers of Table III.

EXAMPLE 39

The coating solution of Example 33 was coated over a silicated aluminum sheet which had been previously sensitized with the zinc chloride double salt of the formaldehyde condensation product of 4-diazodiphenylamine. The plate thus produced had superior storage properties in high humidity, high temperature environments and still behaved as the plates of Example 33 relative to development characteristics.

What is claimed is:

1. A light sensitive adduct comprising the combination of a diazo resin having a plurality of pendant diazonium groups, with a sulfonated polymer having a plurality of sulfonate groups, said sulfonated polymer being selected from the group consisting of sulfonated polyesters and sulfonated polyurethanes.

2. The adduct of claim 1 wherein said sulfonated polymer contains at least one sulfonate group per about 500 to about 8,000 molecular weight of said polymer.

3. The adduct of claim 2 wherein said sulfonated polymer contains at least one sulfonate group per about 1,500 to about 3,000 molecular weight of said polymer.

4. The adduct of claim 1 wherein the ratio of diazo to sulfonate equivalents is less than about 1.5 to 1.

5. The adduct of claim 4 wherein said ratio is from about 0.1 to 1 to about 0.6 to 1.

6. The adduct of claim 4 wherein said ratio is 1.0 to 1.

7. A presensitized light-sensitive article comprising a substrate having coated on one surface thereof a light-sensitive coating comprising an adduct, said adduct comprising the combination of a diazo resin having a plurality of pendant diazonium groups and a sulfonated polymer having a plurality of sulfonate groups, said sulfonated polymer being selected from the group consisting of sulfonated polyesters and sulfonated polyurethanes.

8. The light-sensitive article of claim 7 wherein said sulfonated polymer contains at least one sulfonate group per about 500 to about 8,000 molecular weight of said polymer.

9. The light-sensitive article of claim 7 wherein said sulfonated polymer contains at least one sulfonate group per about 1,500 to about 3,000 molecular weight of said polymer.

10. The light-sensitive article of claim 7 wherein said ratio is from about 0.1 to 1 to about 0.6 to 1.

11. The light-sensitive article of claim 7 wherein said ratio is 1.0 to 1.

12. The light-sensitive article of claim 7 wherein said substrate comprises an aluminum sheet having a permanently hydrophilic surface thereon.

* * * * *

UNITED STATES PATENT AND TRADEMARK OFFICE
CERTIFICATE OF CORRECTION

PATENT NO. : 4,401,743
DATED : August 30, 1983
INVENTOR(S) : Incremona

It is certified that error appears in the above-identified patent and that said Letters Patent is hereby corrected as shown below:

Column 1, line 50, "unrecovered" should read --unremoved--.

Column 6, line 30, "7.4 grams" should read --74.1 grams--.

Column 13, lines 31-35 should read --1. A light sensitive adduct consisting of the combination of a diazo resin having a plurality of pendant diazonium groups and a sulfonated polymer having a plurality of sulfonate groups, said sulfonated polymer being selected from the group consisting of sulfonated polyesters and sulfonated polyurethanes.--

Column 14, lines 12-20 should read --7. A presensitized light-sensitive article comprising a substrate having coated on one surface thereof a light-sensitive coating comprising an adduct, said adduct consisting of the combination of a diazo resin having a plurality of pendant diazonium groups

UNITED STATES PATENT AND TRADEMARK OFFICE
CERTIFICATE OF CORRECTION

PATENT NO. : 4,401,743

DATED : August 30, 1983

INVENTOR(S) : Incremona

It is certified that error appears in the above-identified patent and that said Letters Patent is hereby corrected as shown below:

and a sulfonated polymer having a plurality of sulfonate groups, said sulfonated polymer containing at least one sulfonate group per about 500 to about 8,000 molecular weight of said sulfonated polymer, and wherein the ratio of diazo to sulfonate equivalents is less than about 1.5 to 1, said coating being hydrophobic upon exposure to actinic light, said sulfonated polymer being selected from the group consisting of sulfonated polyesters and sulfonated polyurethanes.--

Signed and Sealed this

Twenty-seventh Day of December 1983

[SEAL]

Attest:

GERALD J. MOSSINGHOFF

Attesting Officer    Commissioner of Patents and Trademarks